United States Patent
Lee et al.

(10) Patent No.: US 7,663,134 B2
(45) Date of Patent: Feb. 16, 2010

(54) MEMORY ARRAY WITH A SELECTOR CONNECTED TO MULTIPLE RESISTIVE CELLS

(75) Inventors: Tzyh-Cheang Lee, Hsinchu (TW);
Chun-Sheng Liang, Puyan (TW);
Jiunn-Ren Hwang, Hsinchu (TW);
Fu-Liang Yang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 122 days.

(21) Appl. No.: 11/775,741

(22) Filed: Jul. 10, 2007

(65) Prior Publication Data
US 2009/0014836 A1    Jan. 15, 2009

(51) Int. Cl.
*H01L 47/00* (2006.01)
(52) U.S. Cl. ............... 257/4; 257/E45.002; 365/148
(58) Field of Classification Search ........... 257/1–4, 257/379, E45.002; 365/148
See application file for complete search history.

(56) References Cited

U.S. PATENT DOCUMENTS

| | | | |
|---|---|---|---|
| 6,566,700 B2 | 5/2003 | Xu | |
| 6,605,821 B1 | 8/2003 | Lee et al. | |
| 6,757,189 B2 * | 6/2004 | Hung et al. | 365/158 |
| 6,816,404 B2 | 11/2004 | Khouri et al. | |
| 6,856,536 B2 * | 2/2005 | Rinerson et al. | 365/148 |
| 6,862,214 B2 | 3/2005 | Lee et al. | |
| 6,867,425 B2 | 3/2005 | Wicker | |
| 6,894,305 B2 | 5/2005 | Yi et al. | |
| 6,912,146 B2 | 6/2005 | Gill et al. | |
| 7,502,252 B2 * | 3/2009 | Fuji et al. | 365/163 |
| 2004/0114428 A1 | 6/2004 | Morikawa | |
| 2004/0150093 A1 | 8/2004 | Pellizzer et al. | |
| 2005/0184282 A1 | 8/2005 | Lai et al. | |
| 2005/0191804 A1 | 9/2005 | Lai et al. | |
| 2006/0050547 A1 | 3/2006 | Liaw et al. | |
| 2006/0087877 A1 * | 4/2006 | Cho et al. | 365/148 |
| 2006/0148229 A1 | 7/2006 | Wang et al. | |
| 2009/0001348 A1 * | 1/2009 | Kaeriyama et al. | 257/4 |

FOREIGN PATENT DOCUMENTS

| | | |
|---|---|---|
| CN | 1505043 A | 6/2004 |
| JP | 2005-340468 | 12/2005 |

(Continued)

OTHER PUBLICATIONS

Anh, S.J., et al., "Highly Manufacturable High Density Phase Change Memory of 64Mb and Beyond," International Electron Devices Meeting, 2004, pp. 907-910, IEEE.

(Continued)

*Primary Examiner*—Jerome Jackson, Jr.
*Assistant Examiner*—Paul A Budd
(74) *Attorney, Agent, or Firm*—Slater & Matsil, L.L.P.

(57) ABSTRACT

An array includes a transistor cpmprising a first terminal, a second terminal and a third terminal; a first contact plug connected to the first terminal of the transistor; a second contact plug connected to the first terminal of the transistor; a first resistive memory cell having a first end and a second end, wherein the first end is connected to the first contact plug; and a second resistive memory cell having a third end and a fourth end, wherein the third end is connected to the second contact plug.

19 Claims, 9 Drawing Sheets

FOREIGN PATENT DOCUMENTS

KR     1020070069764 A     7/2007

OTHER PUBLICATIONS

Bedeschi, F., et al., "An 8Mb Demonstrator for High-Density 1.8V Phase-Change Memories," 2004 Symposium on VLSI Circuits, Digest of Technical Papers, pp. 442-445, IEEE.

Hwang, Y.N., et al., "Writing Current Reduction for High-density Phase-change RAM," International Electron Devices Meeting, 2003, pp. 893-896, IEEE.

* cited by examiner

MEMORY ARRAY WITH A SELECTOR CONNECTED TO MULTIPLE RESISTIVE CELLS

TECHNICAL FIELD

This invention relates generally to semiconductor devices, and more particularly to memory arrays with resistive memory cells.

BACKGROUND

Resistive memory arrays are widely used in integrated circuits. A typical memory cell in a resistive memory array includes resistive devices having at least two states, a high-resistance state and a low-resistance state. The state of a memory cell may be determined by applying a voltage to the memory cell, and determining the current flowing through the memory cell.

FIG. 1 illustrates a portion of a conventional resistive memory array, which includes a plurality of resistive cells arranged in rows and columns. Taking memory cell 2, which is in row j-1 and column i-1, as an example, memory cell 2 includes selection transistor 4 and resistive cell 6, wherein selection transistor 4 is connected to word-line $WL_{j-1}$, and resistive cell 6 is connected to bit-line $BL_{i-1}$. Selection transistor 4 controls the selection of resistive cell 6.

In the recent study of resistive memory arrays, phase change memory (PCM) appears to be a promising candidate for the next-generation non-volatile memories. The operation of PCM memory cells is based on the electrically induced phase change of chalcogenide material, typically $Ge_2Sb_2Te_5$ (GST). The two cell logic states, namely reset and set states, correspond to high and low resistances of the amorphous and the crystalline phases of the active chalcogenide material, respectively. The transitions between two states, which include amorphization and crystallization, are achieved by Joule heating in the chalcogenide material. The amorphization is obtained through melting and rapidly cooling the chalcogenide material, while the crystallization is obtained by holding the chalcogenide material at a high temperature, which is below the melting temperature of the chalcogenide material, for a period of time.

Typically, resistive memory cells need high programming currents. Particularly, the chalcogenide materials need high currents to generate enough Joule heat. Conventionally, bipolar junction transistors (BJT) were favored over metal-oxide-semiconductor (MOS) devices for their ability of providing higher drive currents. However, BJTs are less process-friendly than MOS devices, and their manufacturing involves higher production cost. On the other hand, MOS devices require more chip area than BJTs to provide the same currents as BJTs. Designers thus have to compromise between production cost and chip area usage. Accordingly, new structures and manufacturing methods are needed to manufacture selection transistors that provide enough current for operating resistive cells, while at the same time consuming less chip area.

SUMMARY OF THE INVENTION

In accordance with one aspect of the present invention, an array includes a transistor comprising a first terminal, a second terminal and a third terminal; a first contact plug connected to the first terminal of the transistor; a second contact plug connected to the first terminal of the transistor; a first resistive memory cell having a first end and a second end, wherein the first end is connected to the first contact plug; and a second resistive memory cell having a third end and a fourth end, wherein the third end is connected to the second contact plug.

In accordance with another aspect of the present invention, an integrated circuit structure includes a transistor comprising a first, a second and a third terminal; a contact plug connected to the first terminal; a metal line overlying and connected to the contact plug; a first resistive memory cell having a first bottom electrode overlying and connected to the metal line; and a second resistive memory cell having a second bottom electrode overlying and connected to the metal line.

In accordance with yet another aspect of the present invention, a memory array includes a plurality of resistive memory cells arranged in a plurality of rows and columns is provided. The memory array includes a plurality of word-lines extending in a first direction; a plurality of bit-lines extending in a second direction perpendicular to the first direction; a plurality of transistors connected to the plurality of word-lines, wherein each of the plurality of transistors comprises a first terminal, a second terminal, and a third terminal, and wherein the second terminal of each of the plurality of transistors is connected to a word-line in the plurality of word-lines; a first and a second contact plug connected to a first terminal of one of the plurality of transistors; and a first and a second resistive memory cell in the plurality of resistive memory cells. The first resistive memory cell includes a first end and a second end, wherein the first end is connected to the first contact plug, and the second end is connected to a first bit-line in the plurality of bit-lines. The second resistive memory cell includes a third end and a fourth end, and wherein the third end is connected to the second contact plug, and the fourth end is connected to a second bit-line in the plurality of bit-lines.

Since selectors in the memory array are shared by a plurality of resistive memory cells, the chip area occupied by each memory cell is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
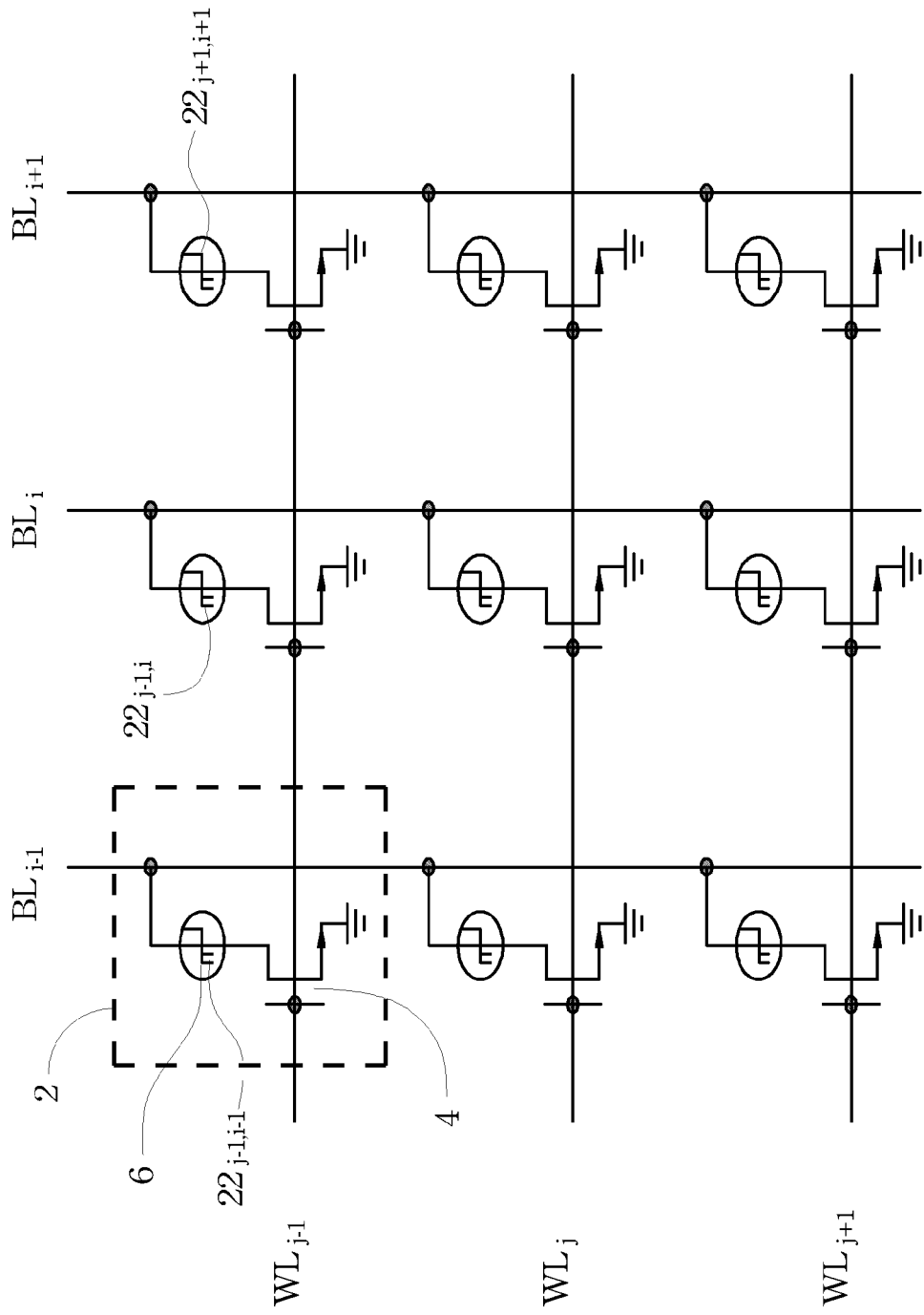
FIG. 1 illustrates a conventional resistive memory array, wherein each transistor controls the selection of a resistive cell.
Figure 2A:
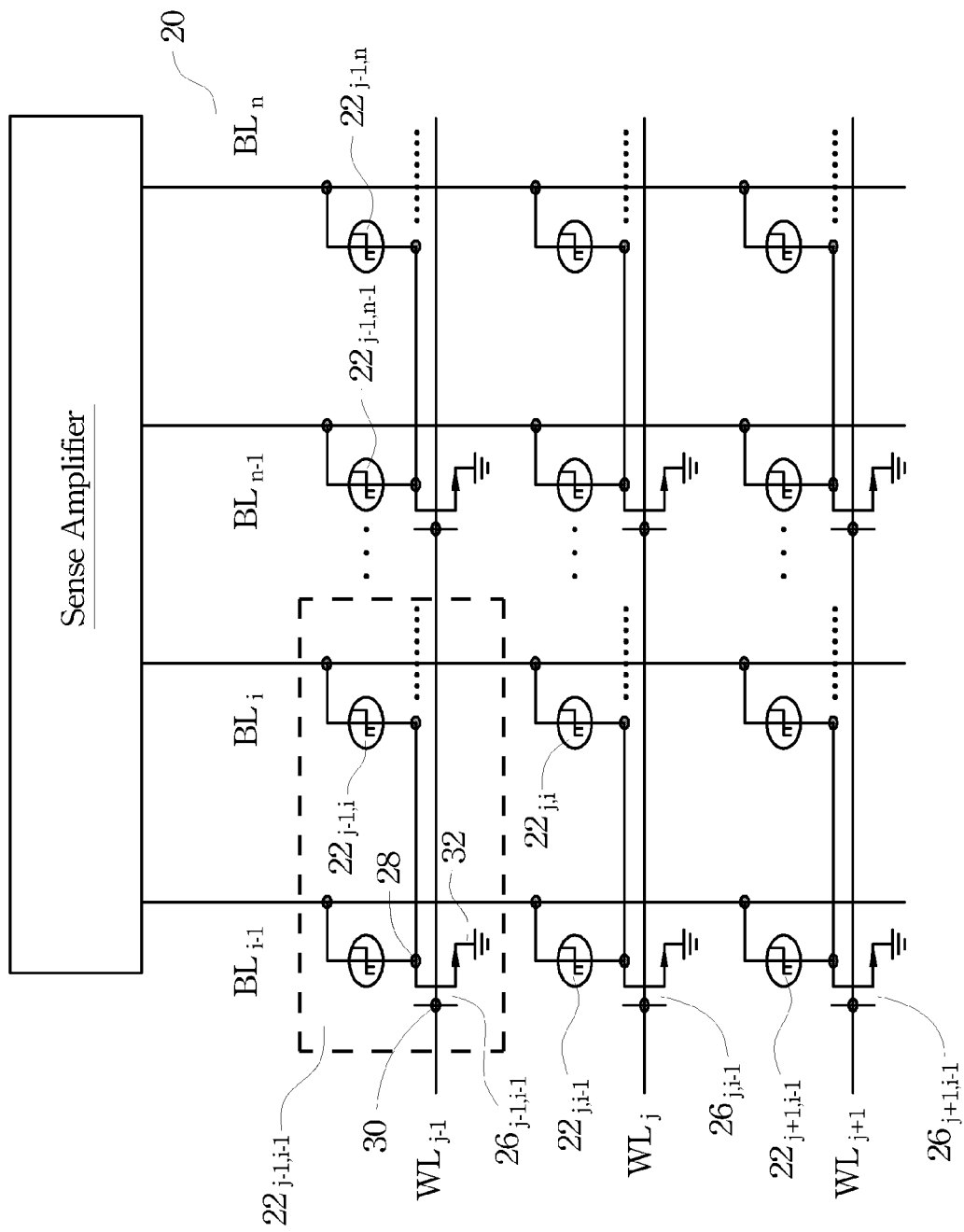
FIG. 2A illustrates a memory array, wherein a MOS transistor controls the selection of a plurality of resistive cells.
Figure 2B:
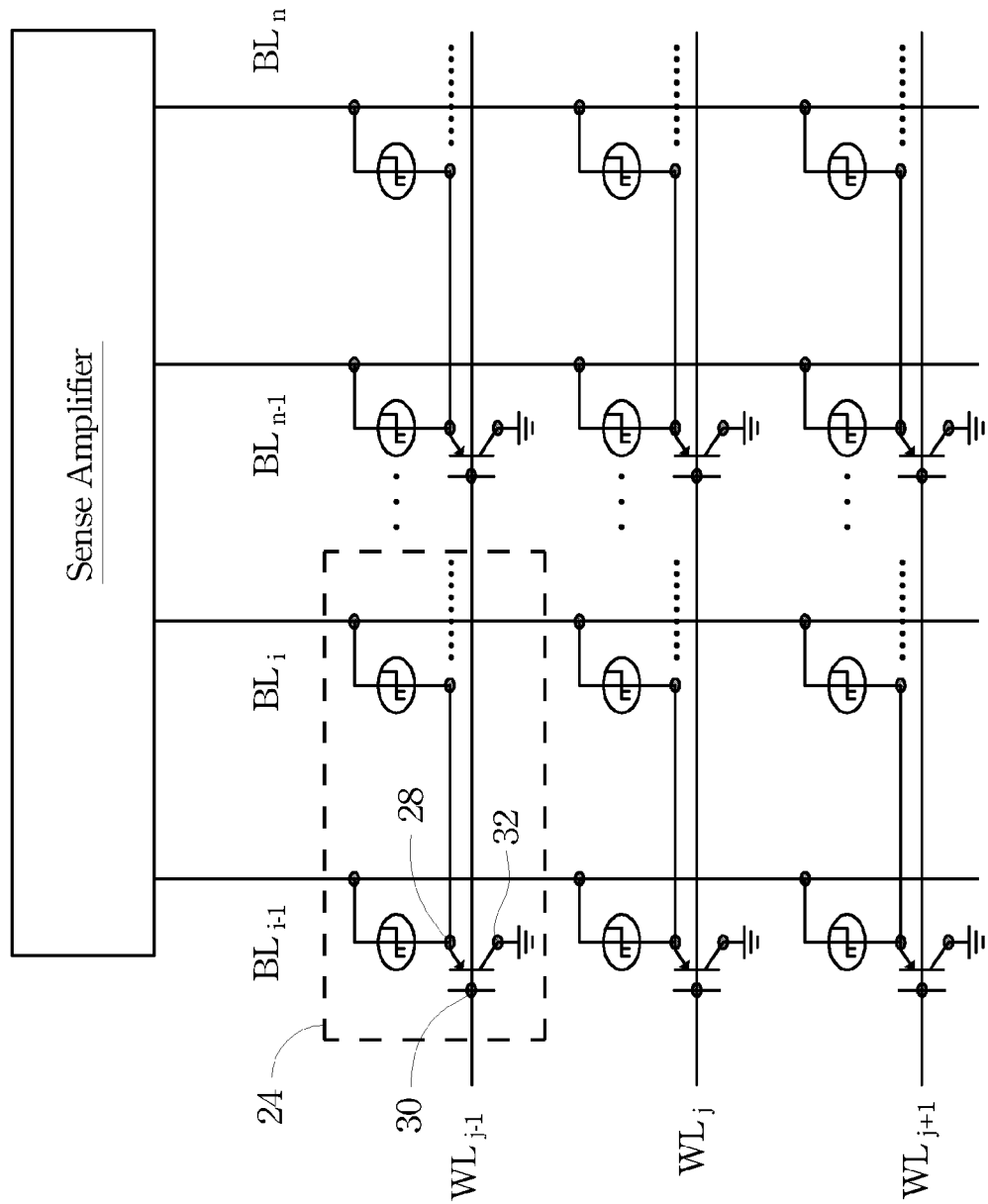
FIG. 2B illustrates a memory array, wherein a bipolar junction transistor controls the selection of a plurality of resistive cells.

FIGS. 2A and 2B each illustrate a schematic circuit diagram of memory array 20, which includes a plurality of resistive cells 22 arranged as a plurality of rows and a plurality of columns. Each resistive cell 22 may be referred to using the respective row number and column number. For example, resistive cell 22 in row j and column i may be referred to as $22_{j,i}$. For simplicity, only three rows j−1, j and j+1 and four columns i−1, i, n−1 and n, are illustrated. However, one skilled in the art will realize that one array may include more rows and columns. In an embodiment, resistive cells 22 include phase change memory (PCM) cells, which may be formed of $Ge_2Sb_2Te_5$ (GST) and respective top and bottom electrodes. However, other resistive cells that can be programmed to two resistances either by applying voltages or currents, such as resistor cells, magnetic-resistive cells, and the like, can also be used.

The resistive memory array 20 further includes a plurality of selectors 26, each controls the selection of a plurality of resistive cells 22. Each of the selectors 26 is referred to using a row number and a column number as its suffixes. Throughout the description, a selector and the resistive cells controlled by the selector are referred to as a unit. In the preferred embodiment, the plurality of selectors 26 are preferably formed of transistors, such as metal-oxide-semiconductor (MOS) transistors, as shown in FIG. 2A, or bipolar junction transistors (BJT), as shown in FIG. 2B. The MOS devices may either be planar transistors or Fin field-effect transistors (FinFET). Each selector 26 includes a first terminal 28, a second terminal 30 and a third terminal 32. For MOS devices (refer to FIG. 2A), the first terminals 28 are drains, the second terminals 30 are gates, and the third terminals 32 are sources. For BJT transistors (refer to FIG. 2B), the first terminals 28 are emitters, the second terminals 30 are bases, and the third terminals 32 are collectors.

The first terminal of each of the selectors 26 is connected to more than one resistive cell 22. For example, first terminal 28 of selector $26_{j-1,i-1}$ is connected to resistive cells $22_{j-1,i-1}$ and $22_{j-1,i}$. Although not illustrated, selector $26_{j-1,i-1}$ may further be connected to more resistive cells. The first terminal of each of the selectors 26 is connected to one of the ends of the respective connecting resistive cells 22. The other ends of the connecting resistive cells 22 may be connected to the respective bit-lines BL, each being referred to using the respective column number. A sense amplifier may be connected to the bit-lines BL in order to determine the status of the resistive cells. The second terminals 30 of the selectors 26 are connected to the respective word-lines WL, each being referred to using the respective row number. The third terminals 32 of the resistive cells 22 may be grounded, or connected to other reference voltages.

Figure 3:
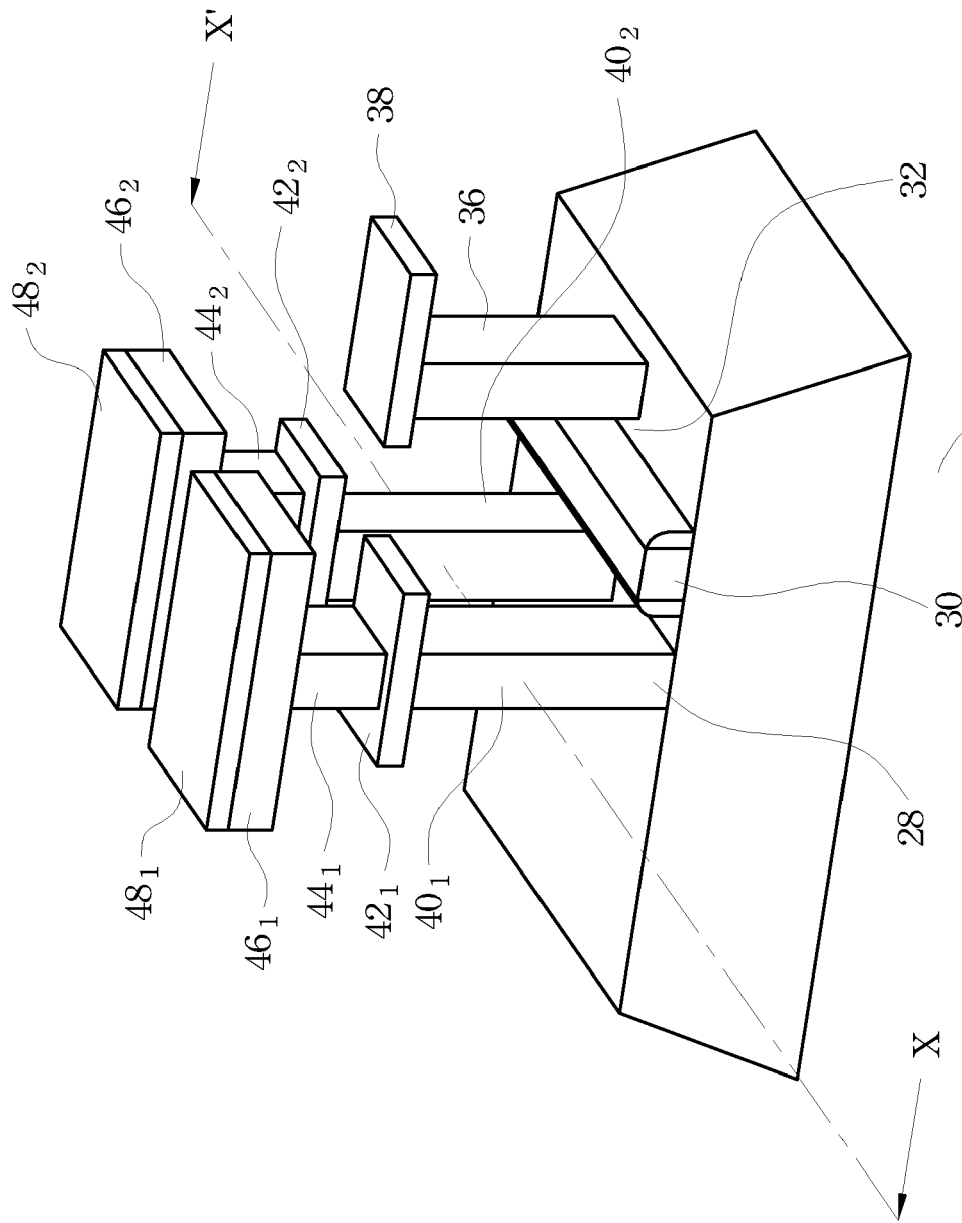
FIG. 3 illustrates a perspective view of an embodiment of the present invention.
Figure 4A:
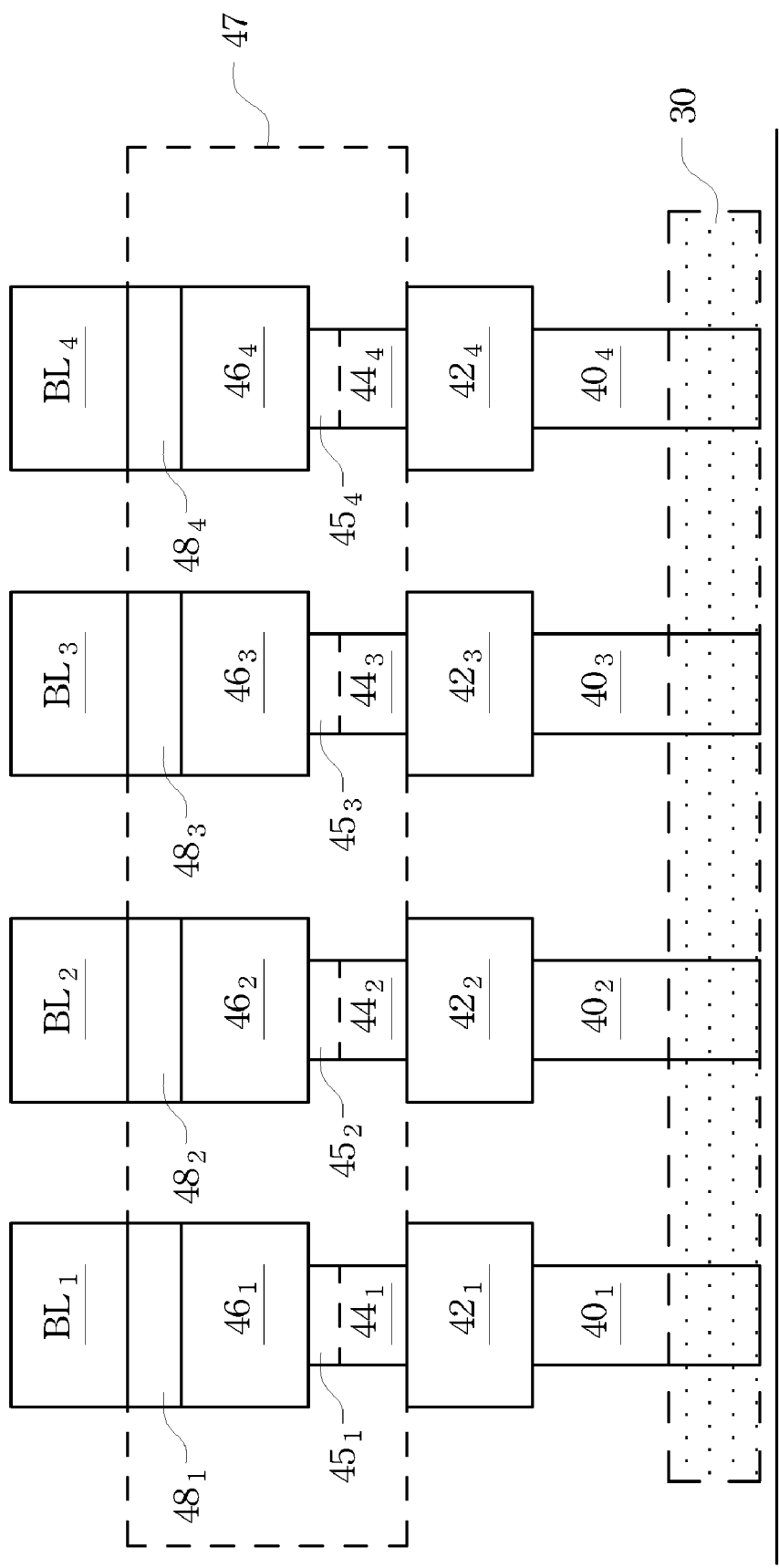
FIGS. 4A through 4E are cross-sectional views of the embodiments of the present invention.
Figure 4B:
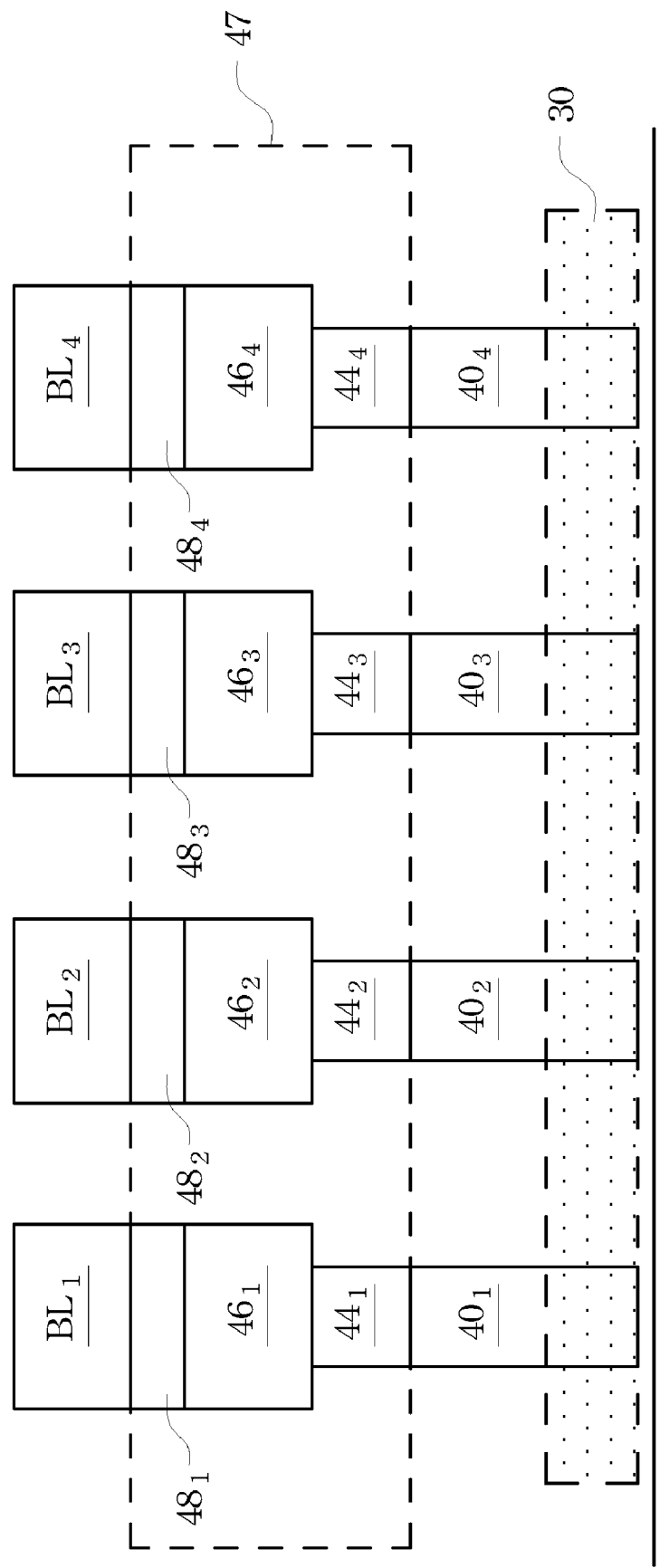
Figure 4C:
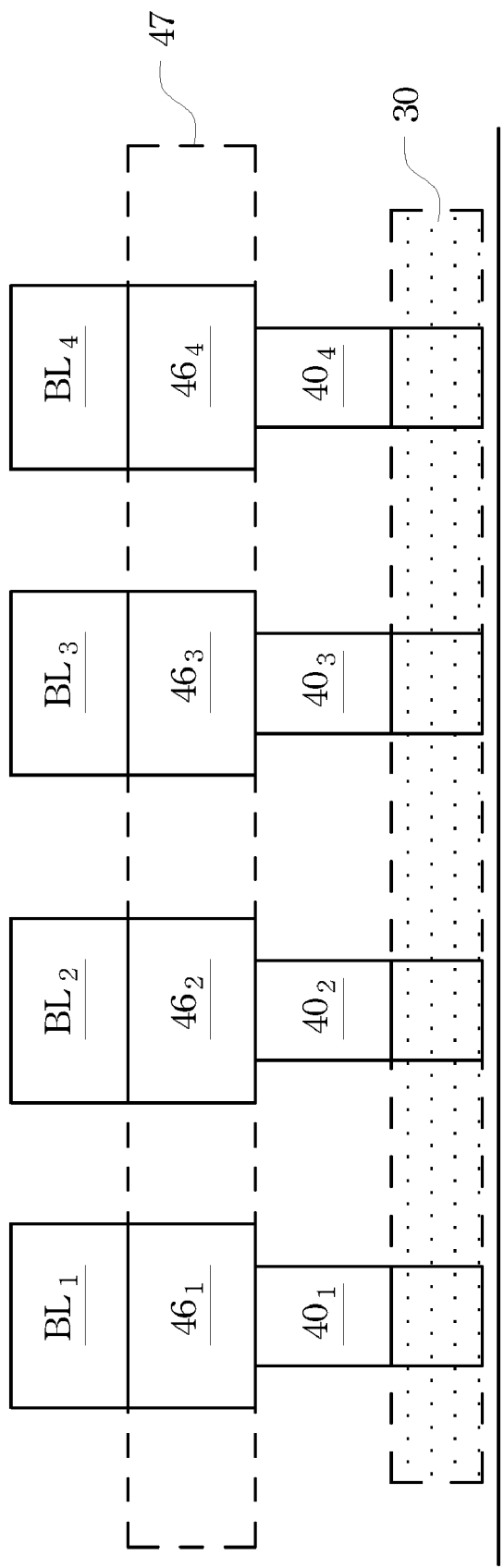
Figure 4D:
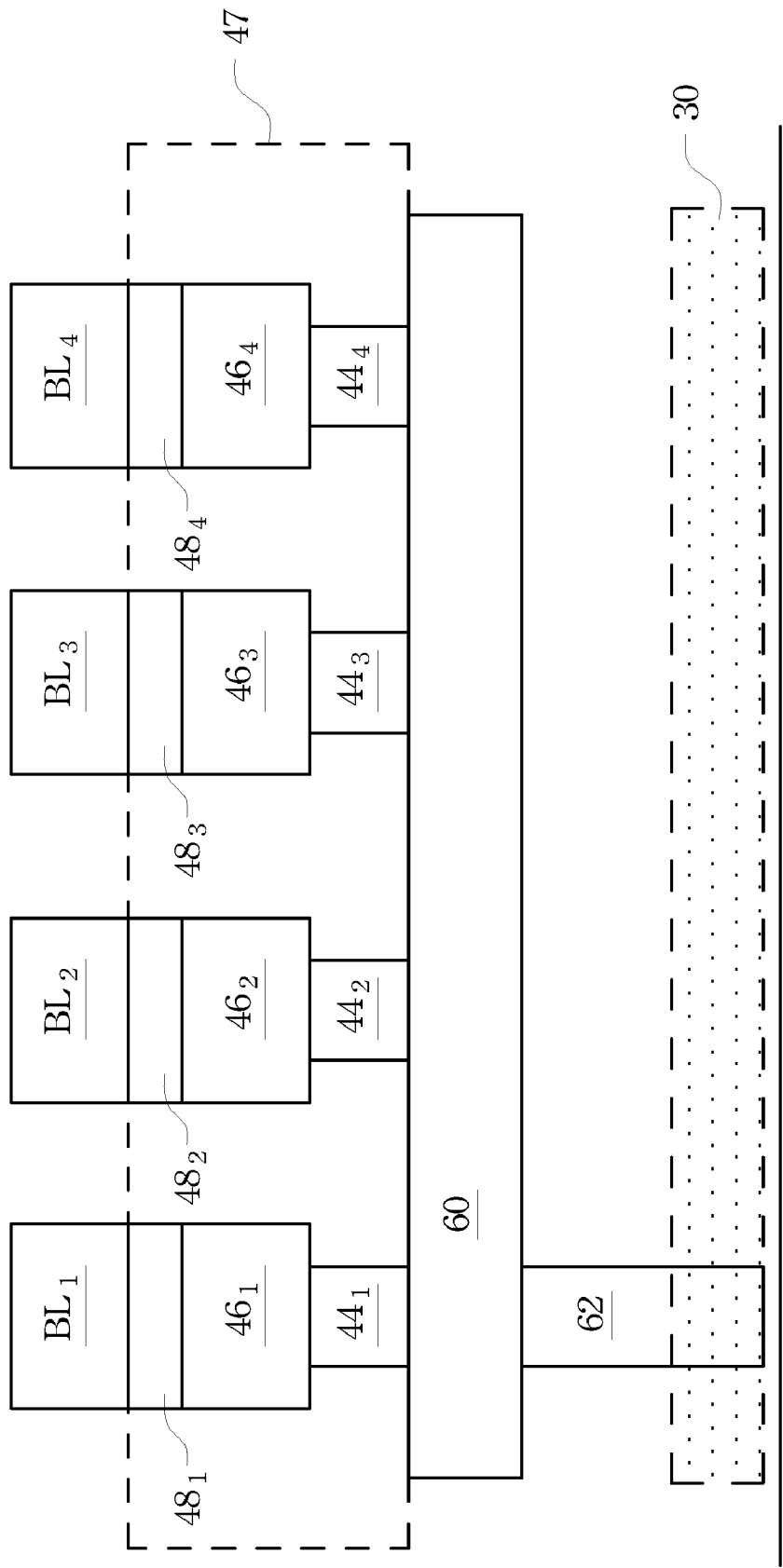

FIGS. 3 through 4D illustrate the implementation details of a unit of the memory array. FIG. 3 is a perspective view of unit 24 in memory array 20. For simplicity, only two of the resistive cells, which are referred with suffices 1 and 2, are shown, although unit 24 may include more resistive cells.

In an embodiment, conductive strips, such as polysilicon strips, which form the second terminal 30 of selector 26, are also used as the word-lines $WL_{j-1}$. However, separate word-lines may be formed in an overlying metallization layer and connected to the second terminal 30 of selector 26. The third terminal 32 of selector 26 is connected to contact 36 and metal line 38, which may further be connected to the ground or other reference voltages. Contact plugs $40_1$ and $40_2$ land on the first terminal 28 of selector 26. Contact $40_1$ is further connected to metal pad $42_1$, bottom electrode $44_1$, phase change element $46_1$, and top electrode $48_1$. Similarly, contact $40_2$ is further connected to metal pad $42_2$, bottom electrode $44_2$, phase change element $46_2$, and top electrode $48_2$. As discussed in the preceding paragraphs, more contacts and resistive elements may land on the first terminal 28.

FIG. 4A illustrates a cross-sectional view of the unit shown in FIG. 3, wherein the cross-sectional view is taken along a vertical plane crossing line X-X'. For simplicity, it is assumed integer i in FIGS. 2A and 2B equals 2, and unit 24 include four resistive cells. Therefore, the column numbers of the four resistive cells are 1, 2, 3 and 4. However, one skilled in the art will realize that the discussion also applies to other units in memory array 20. The second terminal 30 of selector 26 is also illustrated in FIG. 4A, although it is in a different plane. Accordingly, second terminal 30 is illustrated using dashed lines. Contact plugs $40_1$ through $40_4$ are connected to the first terminal 28 (not shown in FIG. 4A, please refer to FIG. 3). In an embodiment, metal pads $42_1$ through $42_4$ are overlying and connected to the respective contact plugs $40_1$ through $40_4$. Metal pads $42_1$ through $42_4$ may be formed in a metallization layer, for example, the first metallization layer (also referred to as M1). Alternatively, metal pads $42_1$ through $42_4$ may be in a metallization layer over M1, and accordingly, more metal lines and vias need to be formed to connect metal pads $42_1$ through $42_4$ to the respective contacts $40_1$ through $40_4$. Metal pads $42_1$ through $42_4$ are preferably formed of metals having high conductivities, such as copper, tungsten, silver, and combinations thereof.

Bottom electrodes $44_1$ through $44_4$ are formed over and electrically connected to metal pads $42_1$ through $42_4$, respectively. In an embodiment wherein the resistive cells are PCM cells, bottom electrodes $44_1$ through $44_4$ preferably have a higher resistivity than metal pads $42_1$ through $42_4$ and contact plugs $40_1$ through $40_4$. Accordingly, Joule heat may be generated in bottom electrodes $44_1$ through $44_4$ so that the overlying resistive elements, which may be PCM elements, $46_1$ through $46_4$ are programmed. Accordingly, the materials in bottom electrodes $44_1$ through $44_4$ may include TiAlN, TiN, and the like.

Resistive elements $46_1$ through $46_4$ are formed over bottom electrodes $44_1$ through $44_4$, respectively. In an exemplary embodiment, resistive elements $46_1$ through $46_4$ are formed of phase change materials, also sometimes referred to as chalcogenide materials. The phase change materials may include chalcogenide materials, preferably $Ge_xSb_yTe_z$, wherein x, y and z indicate the ratio of the respective numbers. In alternative embodiments, the phase change materials that can be symbolized as $Ge_xSb_yTe_zX$ are used, wherein X is a material selected from Ag, Sn, In, and combinations thereof. Preferably, the cross-sectional areas (viewed from top) of bottom electrodes $44_1$ through $44_4$ are smaller than the cross-sectional areas of resistive elements $46_1$ through $46_4$, if they are formed of chalcogenide materials, so that the efficiency of the phase transitions is improved.

The structure shown in FIG. 4A may optionally include conductive adhesion layers $45_1$ through $45_4$ between resistive elements $46_1$ through $46_4$ and the respective bottom electrodes $44_1$ through $44_4$. The conductive adhesion layers $45_1$ through $45_4$ may include conductive materials such as polysilicon, TiSiC, C, TiW, SiC, Ti, V, W, Cr, Fe, Ni, Nb, Pd, Pt, Zr, Mo, Cu, Al, Ag, Au, Hf, and alloys thereof. Alternatively, metal nitrides such as TiN, TaN, TiSiN, TiAlN, TiCN, TaSiN, MoN, TaAlN and WN, metal silicides such as TiSix, NiSix, CoSix, oxides such as $Al_2O_3$, $Ta_2O_5$, $TiO_2$, conductive oxides such as $IrO_2$, $RuO_2$, $IrRuO_3$, $LiNbO_3$, and combinations thereof, can be used.

Top electrodes $48_1$ through $48_4$ are formed over the respective resistive elements $46_1$ through $46_4$. In an embodiment, top electrodes $48_1$ through $48_4$ are preferably formed using similar materials as in bottom electrodes $44_1$ through $44_4$, and thus have a resistivity similar to that of bottom electrodes $44_1$ through $44_4$, although they may include different materials. In alternative embodiments, top electrodes $48_1$ through $48_4$ are formed of materials having a higher conductivity than bottom electrodes $44_1$ through $44_4$.

Each of the top electrodes $48_1$ through $48_4$ is electrically connected to an overlying bit-line $BL_1$ through $BL_4$, which are formed in a higher metallization layer. Vias (not shown) may further be formed between electrodes $48_1$ through $48_4$ and the respective bit-lines $BL_1$ through $BL_4$.

FIG. 4B illustrates an alternative embodiment of the present invention. In this embodiment, the resistive cells, which include the elements inside dashed frame 47, are formed under the first metallization layer M1, and hence bottom electrodes $44_1$ through $44_4$ are directly connected to the underlying contact plugs $40_1$ through $40_4$. Accordingly, bit-lines $BL_1$ through $BL_4$ may be formed in metallization layer M1.

FIG. 4C illustrates an embodiment wherein the resistive cells include no top and bottom electrodes. Accordingly, the resistive cells as inside dashed frame 47 are in contact with the respective contact plugs directly.

In the embodiments shown in FIGS. 4A, 4B and 4C, resistive elements $46_1$ through $46_4$ are only connected to the first terminal 28 (refer to FIG. 3) through separate contact plugs. Advantageous, this reduces the bit disturbance between the program currents on different bit-lines.

FIG. 4D illustrates a further embodiment of the present invention, wherein the resistive cells are connected to terminal 28 (refer to FIG. 3) through common metal line 60 and common contact plug 62. In an embodiment, metal line 60 is formed in a metallization layer, which may be the lowest metallization layer M1 or an overlying metallization layer. Bottom electrodes $44_1$ through $44_4$ are connected to metal line 60. As discussed in preceding paragraphs, bottom electrodes $44_1$ through $44_4$ preferably have a lower conductivity than metal line 60 for the purpose of generating Joule heat. Furthermore, the cross-sectional areas (viewed from top) of bottom electrodes $44_1$ through $44_4$ are preferably smaller than the cross-sectional areas of resistive elements $46_1$ through $46_4$.

Figure 4E:
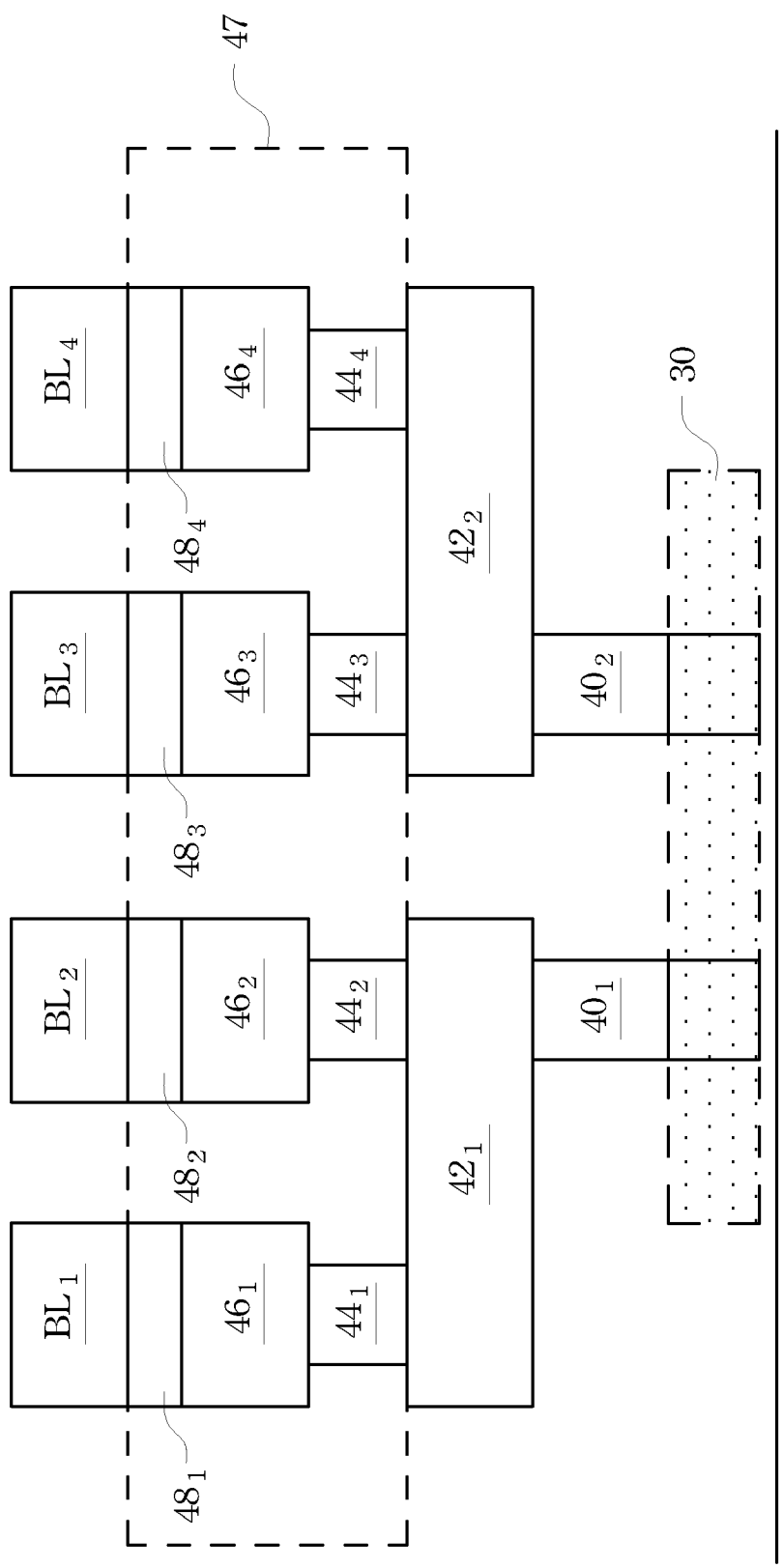

FIG. 4E illustrates an additional embodiment, wherein the resistive cells, which include components in the dashed frame 47, are grouped, and each group of resistive cells is connected to the corresponding selector through a common contact plug. However, different groups of resistive cells are connected to different contact plugs. For example, in the embodiment illustrated in FIG. 4E, two groups of resistive cells are connected to the selector through contact plugs $40_1$ and $40_2$.

In the embodiments shown in FIGS. 4A through 4E, PCM memory cells are used as examples to explain the concept of the present invention. One skilled in the art will realize that the resistive cells shown in the dashed frames 47 may be replaced by other types of resistive cells.

The embodiments of the present invention have the advantageous feature of reducing the chip area of resistive memory arrays. By controlling the selection of a plurality of resistive cells using one selector, the selector can be formed larger, so that a greater current can be provided. In the meantime, the chip area per cell is reduced. For example, in a conventional memory array in which each selector is connected to only one resistive cell, the average area per cell is about $40\,F^2$, wherein F indicates the dimension of the corresponding formation technology. In 45 nm technology, F is equal to 45 nm. If each selector is connected to two resistive cells, the average area per cell is only about $34\,F^2$. Further increasing the number of resistive cells connected to one selector, the average chip area per cell will be further reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
a transistor comprising a first terminal, a second terminal and a third terminal;
a first contact plug connected to the first terminal of the transistor;
a second contact plug connected to the first terminal of the transistor;
a first resistive memory cell having a first end and a second end, wherein the first end is connected to the first contact plug;
a second resistive memory cell having a third end and a fourth end, wherein the third end is connected to the second contact plug;
a word-line extending in a first direction, wherein the second terminal of the transistor is connected to the word-line;
a first bit-line connected to the second end and extending in a second direction perpendicular to the first direction; and
a second bit-line connected to the fourth end and extending in the second direction, wherein the first resistive memory cell comprises a first top electrode connected to the first bit-line, the second resistive memory cell comprises a second top electrode connected to the second bit-line, and wherein the first and the second top electrodes have a higher resistivity than the first and the second bit-lines.

2. The integrated circuit structure of claim 1, wherein the transisitor is a bipolar junction transistor (BJT), and wherein the first, the second and the third terminals of the transistor are an emitter, a base and a collector, respectively.

3. The integrated circuit structure of claim 1, wherein the transisitor is a planar metal-oxide-semiconductor (MOS device), and wherein the first, the second and the third terminals of the transistor are a drain, a gate and a source, respectively.

4. The integrated circuit structure of claim 1, wherein the transisitor is a Fin field-effect transistor (FinFET), and wherein the first, the second and the third terminals of the transistor are a drain, a gate and a source, respectively.

5. The integrated circuit structure of claim 1, wherein the first and the second resistive memory cells are selected from the group consisting essentially of phase change memory cells, resistor cells and magnetic-resistive cells.

6. The integrated circuit structure of claim 1, wherein the first and the second resistive memory cells each comprise a bottom electrode underlying a resistive element, and wherein the bottom electrode is between the resisitive element and the respective one of the first and the second contact plugs.

7. The integrated circuit structure of claim 6 further comprising a first and a second metal pad underlying the bottom electrodes of the first and the second resistive memory cells, respectively, wherein the first and the second metal pads are formed in a metallization layer.

8. The integrated circuit structure of claim 6, wherein the bottom electrodes of the first and the second resistive memory cells have a higher resistivity than the first and the second metal pads.

9. The integrated circuit structure of claim 1, wherein the first resistive memory cell physically contacts the first bit-line and the first contact plug, and the second resistive memory cell physically contacts the second bit-line and the second contact plug.

10. A memory array comprising a plurality of resistive memory cells arranged in a plurality of rows and columns, the memory array comprising:
  a plurality of word-lines extending in a first direction;
  a plurality of bit-lines extending in a second direction perpendicular to the first direction;
  a plurality of transistors connected to the plurality of word-lines, wherein each of the plurality of transistors comprises a first terminal, a second terminal, and a third terminal, and wherein the second terminal of each of the plurality of transistors is connected to a word-line in the plurality of word-lines;
  a first and a second contact plug connected to a first terminal of one of a plurality of transistors;
  a first resistive memory cell in the plurality of resistive memory cells, wherein the first resistive memory cell comprises a first end and a second end, and wherein the first end is connected to the first contact plug, and the second end is connected to a first bit-line in the plurality of bit lines;
  a second resistive memory cell in the plurality of resistive memory cells, wherein the second resistive memory cell comprises a third end and a fourth end, and wherein the third end is connected to the second contact plug, and the fourth end is connected to a second bit-line in the plurality of bit-lines;
  additional contact plugs separated from the first and the second contact plugs; and
  additional resistive memory cells connected to the first terminal of the one of the plurality of transistors through the additional contact plugs.

11. The memory array of claim 10, wherein a third terminal of the one of the plurality of transistors is grounded.

12. The memory array of claim 10, wherein the first and the second resistive memory cells each comprise a bottom electrode having a higher resistivity than the first and the second contact plugs.

13. The memory array of claim 10, wherein the plurality of transistors is substantially identical, and is selected from the group consisting essentially of bipolar junction transistors (BJT), planar metal-oxide-semiconductor (MOS) devices, and Fin field-effect transistors (FinFETs).

14. An integrated circuit structure comprising:
  a transistor comprising a first terminal, a second terminal and a third terminal;
  a first contact plug connected to the first terminal of the transistor; a second contact plug connected to the first terminal of the transistor;
  a first resistive memory cell having a first end and a second end, wherein the first end is connected to the first contact plug;
  a second resistive memory cell having a third end and a fourth end, wherein the third end is connected to the second contact plug;
  the first and the second resistive memory cells each comprise a bottom electrode underlying a resistive element, and wherein the bottom electrode is between the resistive element and the respective one of the first and the second contact plugs; and
  a first metal pad and a second metal pad underlying a bottom electrode of the first resistive memory cell and the second resistive memory cell, respectively, wherein the first metal pad and the second metal pad are formed in a metallization layer.

15. The integrated circuit structure of claim 14 further comprising:
  a word-line extending in a first direction, wherein the second terminal of the transistor is connected to the word-line; and
  a first bit-line and a second bit-line connected to the second and the fourth ends, respectively, wherein the first and the second bit-lines extend in a second direction perpendicular to the first direction.

16. The integrated circuit structure of claim 15, wherein the first resistive memory cell comprises a first top electrode connected to the first bit-line, the second resistive memory cell comprises a second top electrode connected to the second bit-line, and wherein the first and the second top electrodes have a higher resistivity than the first and the second bit-lines.

17. The integrated circuit structure of claim 14, wherein the transistor is a bipolar junction transfer (BJT), and wherein the first, the second and the third terminals of the transistor are an emitter, a base and a collector, respectively.

18. The integrated circuit structure of claim 14, wherein the transistor is a planar metal-oxide-semiconductor (MOS) device, and wherein the first, the second, and the third terminals of the transistor are a drain, a gate, and a source, respectively.

19. The integrated circuit structure of claim 14, wherein the transistor is a Fin field-effect transistor (FinFET), and wherein the first, the second and the third terminals of the transistor are a drain, a gate, and a source, respectively.

* * * * *

UNITED STATES PATENT AND TRADEMARK OFFICE
CERTIFICATE OF CORRECTION

| | | |
|---|---|---|
| PATENT NO. | : 7,663,134 B2 | Page 1 of 1 |
| APPLICATION NO. | : 11/775741 | |
| DATED | : February 16, 2010 | |
| INVENTOR(S) | : Lee et al. | |

It is certified that error appears in the above-identified patent and that said Letters Patent is hereby corrected as shown below:

On the Title Page, item (57) ABSTRACT, 1$^{st}$ line, delete "cpmprising" and insert --comprising--.
    In the claims, Col. 6, lines 58-59, delete "(MOS device)" and insert --(MOS) device--.
    In the claims, Col. 7, line 6, delete "resisitive" and insert --resistive--.
    In the claims, Col. 7, line 35, delete "a" and insert --the--.
    In the claims, Col. 8, line 45, delete "transfer" and insert --transistor--.

Signed and Sealed this

Twentieth Day of April, 2010

David J. Kappos
*Director of the United States Patent and Trademark Office*